US009250992B1

(12) United States Patent
Tam et al.

(10) Patent No.: US 9,250,992 B1
(45) Date of Patent: Feb. 2, 2016

(54) TEST DATA REPORTING DURING MEMORY TESTING

(71) Applicant: Marvell International Ltd., Hamilton (BM)

(72) Inventors: Kit Sang Tam, Menlo Park, CA (US); Winston Lee, Palo Alto, CA (US); Robert Bateman, Scottsdale, AZ (US); Kresten V. McGrath, Gilbert, AZ (US); David Lippincott, Tempe, AZ (US)

(73) Assignee: Marvell International Ltd., Hamilton (BM)

( * ) Notice: Subject to any disclaimer, the term of this patent is extended or adjusted under 35 U.S.C. 154(b) by 110 days.

(21) Appl. No.: 14/246,854

(22) Filed: Apr. 7, 2014

Related U.S. Application Data

(60) Provisional application No. 61/820,404, filed on May 7, 2013.

(51) Int. Cl.
*G06F 11/00* (2006.01)
*G06F 11/07* (2006.01)
*G11C 29/12* (2006.01)
*G06F 11/27* (2006.01)

(52) U.S. Cl.
CPC ............ *G06F 11/0787* (2013.01); *G06F 11/27* (2013.01); *G06F 2201/86* (2013.01); *G11C 29/12* (2013.01)

(58) Field of Classification Search
CPC ........................ G06F 11/0766–11/0787; G06F 11/27–11/277; G06F 11/3037; G06F 11/22–11/2242; G06F 11/2268; G06F 2201/86; G11C 29/08–29/46
See application file for complete search history.

(56) References Cited

U.S. PATENT DOCUMENTS

| 4,835,774 | A | 5/1989 | Ooshima |
| 6,405,331 | B1 | 6/2002 | Chien |
| 6,442,723 | B1 * | 8/2002 | Koprowski .... G01R 31/318371 714/732 |
| 6,690,595 | B1 * | 2/2004 | Srinivasan ............. G11C 15/00 365/189.07 |
| 6,877,118 | B2 | 4/2005 | Oshima |
| 7,117,415 | B2 * | 10/2006 | Forlenza ........ G01R 31/318371 714/733 |
| 7,213,186 | B2 | 5/2007 | Chien |
| 7,240,267 | B2 | 7/2007 | Jayabharathi |
| 7,673,207 | B2 | 3/2010 | Urabe |
| 8,214,706 | B2 | 7/2012 | Urabe |
| 8,423,841 | B1 | 4/2013 | Lee |
| 2011/0055646 | A1 | 3/2011 | Mukherjee |

FOREIGN PATENT DOCUMENTS

WO    WO00/11566 A1    3/2000

* cited by examiner

*Primary Examiner* — Jason Bryan

(57) ABSTRACT

In some implementations, a built-in self-test (BIST) circuitry of a memory device is configured to perform an execution of a test sequence to test the memory device, wherein performing the execution comprises generating addresses of the memory device in accordance with the test sequence and advancing a value of a modulo counter as each of the addresses is generated, enable error logging when a generated address and a value of the modulo counter corresponding to the generated address match an address and a value of the modulo counter stored for a previously detected error, detect an error in data read from the memory device after enabling error logging, and store information associated with the detected error.

22 Claims, 4 Drawing Sheets

TEST DATA REPORTING DURING MEMORY TESTING

CROSS REFERENCE TO RELATED APPLICATION

This disclosure claims the benefit of priority under 35 U.S.C. §119(e) of U.S. Provisional Application No. 61/820,404, filed May 7, 2013, the disclosure of which is hereby incorporated by reference in its entirety.

FIELD OF USE

The present disclosure relates to testing memory and reporting failed memory locations.

BACKGROUND

Memory testing involves determining failed memory locations, typically by writing data to an array of memory locations, reading data from the memory locations, and comparing the read data to the data previously written. A memory can be tested using an external memory tester or a built-in self-test (BIST). An external memory tester has direct access to the memory's control, address, and data pins. As the memory is tested, the row address and the column address of each failed memory location are stored in the external memory tester. A BIST includes testing circuitry that is embedded in the memory to be tested. The BIST executes a set of algorithmic verification tests directly on the memory array.

A BIST scheme for testing a memory includes a "stop and resume" scheme. In the "stop and resume" scheme, the BIST suspends memory testing when an error is detected. After the incorrect test response is read from the BIST, the BIST resumes testing of the memory. The "stop and resume" scheme tests the memory at a speed that may be slower than the rated functional speed or intended operating speed of the memory and may not detect time-related errors that occur at the memory's rated functional speed. To test a memory for time-related errors, the memory is tested at the rated functional speed using a BIST scheme such as a "count" scheme. In the "count" scheme, the BIST gathers error information and increments a counter value when an error is detected. In successive test repetitions, the BIST does not gather error information until the number of errors surpasses the counter value. In the "count" scheme, the number of errors reported may be limited by the maximum counter value, and intermittent errors may interfere with the reporting of consistently repeatable errors.

SUMMARY

The present disclosure describes systems and techniques relating to testing memory and reporting failed memory locations. In general, in one aspect, BIST circuitry of a memory device is configured to perform an execution of a test sequence to test the memory device, wherein performing the execution comprises generating addresses of the memory device in accordance with the test sequence and advancing a value of a modulo counter as each of the addresses is generated, enable error logging when a generated address and a value of the modulo counter corresponding to the generated address match an address and a value of the modulo counter stored for a previously detected error, detect an error in data read from the memory device after enabling error logging, and store information associated with the detected error, wherein storing the information comprises storing an address generated for reading the data associated with the detected error from a location of the memory device and storing a value of the modulo counter corresponding to the address generated for reading the data.

The described systems and techniques can be implemented so as to realize one or more of the following advantages. The BIST circuitry need not limit the number of errors that can be reported and thus can report error information for an entire memory. The BIST circuitry can execute an entire test sequence uninterrupted at the intended operating speed of the memory under test to detect time-related errors that occur at the memory's intended operating speed. The BIST circuitry can be run synchronously with the memory under test. The BIST circuitry can store information that specifies the exact memory location of an error in memory devices that include multiple memories. The BIST circuitry can detect and report consistently repeatable errors and intermittent errors by matching error signatures generated during multiple executions of the test sequence.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DETAILED DESCRIPTION

Various implementations of the present disclosure are discussed below in the context of a built-in self-test (BIST) for testing a memory device. The systems and techniques described in this disclosure are generally applicable to any memory device for which it is desirable to provide memory testing and failure reporting, and generally applicable to any internal or external memory tester that provides memory testing and failure reporting. While specific implementations of memory and memory testers are illustrated and described, many other memory and memory tester implementations may exist that include components different than those illustrated and described below.

Figure 1:
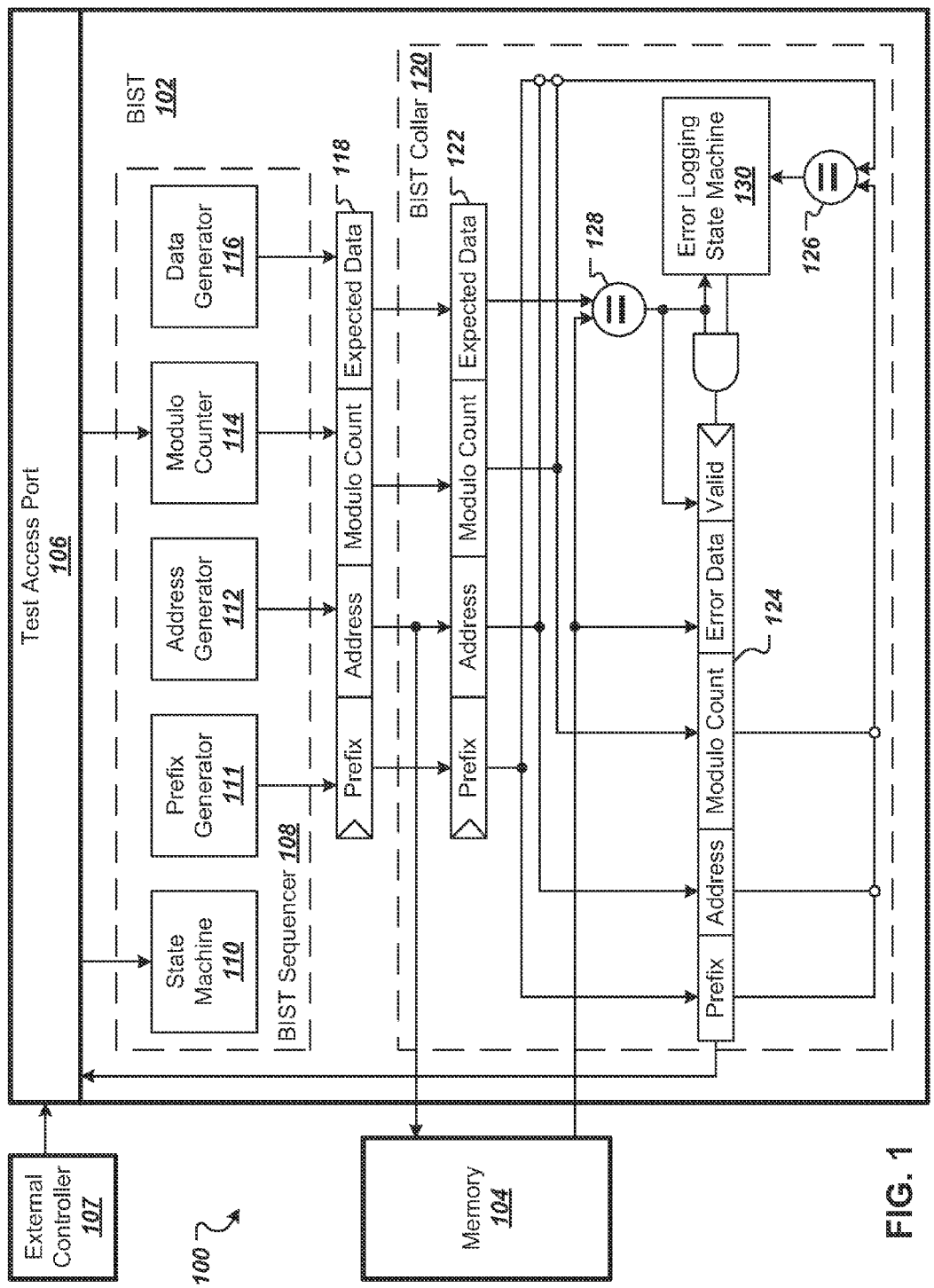
FIG. 1 is a block diagram showing an example of a system that includes a BIST for providing memory testing and error reporting for a memory.

FIG. 1 is a block diagram showing an example of a system 100 that includes a BIST circuitry 102 for providing memory testing and error reporting for a memory 104. The memory 104 may include any memory device for which it is desirable to provide memory testing and failure reporting. In some implementations, the memory 104 may include a volatile memory, such as random-access memory (RAM), including a dynamic random-access memory (DRAM), a static random-access memory (SRAM), a double data rate random-access memory (DDR RAM), or other similar devices. In some implementations, the memory 104 may include a non-volatile memory, such as a flash memory, a hard disk, a floppy disk, a magnetic tape, or other persistent storage devices. The memory 104 may include one or more memory devices, chips, or modules.

The system 100 may include a test access port (TAP) 106. The TAP 106 is an interface through which an external test controller 107 can send instructions to and receive results from the BIST circuitry 102. The TAP 106 may be implemented according to the Joint Test Action Group (JTAG) standard or any other suitable interface configuration for testing memory devices. The BIST circuitry 102, the memory 104, and the TAP 106 can be included in an integrated circuit device, such as a system on chip (SoC) device.

The BIST circuitry 102 may include a BIST sequencer 108 that controls execution of a test sequence for testing the memory 104. The BIST sequencer 108 and the memory 104 may run synchronously, e.g., under the control of the same clock signal. The BIST sequencer 108 may include a state machine 110, a prefix generator 111, an address generator 112, a modulo counter 114, and a data generator 116. The BIST sequencer 108 may control execution of the test sequence such that the entire test sequence, e.g., from the first address of the test sequence to the last address of the test sequence, is executed uninterrupted at the intended operating speed of the memory 104.

The state machine 110 executes the test sequence by controlling the prefix generator 111, the address generator 112, the modulo counter 114, and the data generator 116. The state machine 110 may receive instructions from the external test controller 107 through the TAP 106 for starting or restarting execution of the test sequence. The state machine 110 may execute the test sequence to completion unless an instruction is received to restart execution of the test sequence.

The prefix generator 111 generates a prefix that indicates the direction in which memory addresses are being accessed (e.g., an ascending direction or a descending direction), the address sequence at which the memory is being tested (e.g., row fast or column fast), or both. For example, the prefix may include two bits where the first bit specifies the direction and the second bit specifies the address sequence. When the addresses are being accessed in ascending direction, the first bit may be set to "1". When the addresses are being accessed in a descending direction, the first bit may be set to "0". When the address sequence is row fast, the second bit may be set to "1". When the address sequence is column fast, the second bit may be set to "0". The change in the prefix generated by the prefix generator 111 may be controlled by the state machine 110.

The address generator 112 generates addresses of memory locations of the memory 104 accessed by the test sequence and control signals for accessing the memory locations. The data generator 116 generates the data that is to be written to or expected to be read from the memory locations corresponding to the addresses generated by the address generator 112.

The modulo counter 114 generates a modulo count value. The modulo counter 114 counts from an initial state, e.g., a value of 0, to a wraparound value, e.g., a value of N-1, and then resets to the initial state. The modulo counter 114 operates in unison with the address generator 112. The modulo counter 114 advances the modulo count value when the address generator 112 generates an address of the test sequence. The count direction and initial state of the modulo counter 114 may be controlled by the state machine 110.

When executing a memory test sequence, the BIST sequencer 108 may perform read and write operations to the entire address space of the memory 104 multiple times. An example of a test sequence that performs multiple passes over the entire address space of the memory 104 is a "march" test sequence. During the first pass of a "march" test sequence, the BIST sequencer 108 may issue commands to write "0" to each memory location. During the second pass, the BIST sequencer 108 may issue commands to read each memory location. During the third pass, the BIST sequencer 108 may issue commands to write "1" to each memory location. During the fourth pass, the BIST sequencer 108 may issue commands to read each memory location.

As the address generator 112 generates each of the addresses of the memory locations accessed by the test sequence, the modulo counter 114 advances the modulo count value. The maximum number of count values generated by the modulo counter 114 may be set to a number that is a relative prime of the number of memory locations accessed during a pass of the test sequence and greater than the number of passes over the memory 104 during the test sequence. The maximum number of count values and the number of memory locations accessed during a pass are relative prime numbers when the numbers are not divisible by each other. As an example, for a memory that has 8 memory locations and a test sequence that performs 4 passes over the memory, the maximum number of count values generated by the modulo counter 114 may be set to 5. The addresses generated by the address generator 112 and corresponding modulo count values generated by the modulo counter 114 for the above example where the addresses are accessed in an ascending direction are shown in Table 1 below.

TABLE 1

| Pass 1 | | Pass 2 | | Pass 3 | | Pass 4 | |
|---|---|---|---|---|---|---|---|
| Address | Count | Address | Count | Address | Count | Address | Count |
| 0 | 0 | 0 | 3 | 0 | 1 | 0 | 4 |
| 1 | 1 | 1 | 4 | 1 | 2 | 1 | 0 |
| 2 | 2 | 2 | 0 | 2 | 3 | 2 | 1 |
| 3 | 3 | 3 | 1 | 3 | 4 | 3 | 2 |
| 4 | 4 | 4 | 2 | 4 | 0 | 4 | 3 |
| 5 | 0 | 5 | 3 | 5 | 1 | 5 | 4 |
| 6 | 1 | 6 | 4 | 6 | 2 | 6 | 0 |
| 7 | 2 | 7 | 0 | 7 | 3 | 7 | 1 |

An address and its corresponding modulo count value may be concatenated to generate an error signature. In general, an error signature will repeat after M×N error signatures have been generated, where M is the number of memory locations and N is the maximum number of count values. Each error signature within the M×N error signatures is unique. As shown in Table 1 above, each error signature generated during a test sequence that performs 4 passes over 8 memory locations accessed in a single direction is unique, and an error signature will repeat after 40 error signatures have been generated. For each repetition of the test sequence, the error signatures will repeat in the same order.

In some implementations, during execution of a memory test sequence, the memory addresses may be accessed in both an ascending direction and a descending direction, the memory may be tested using different address sequences such as row fast and column fast, or both. For a "march" test sequence where the addresses are accessed in an ascending direction and then in a descending direction, two error signatures (e.g., "0,0" and "5,0") repeat during the first two passes of the "march" test, as shown in Table 2 below.

TABLE 2

| Pass 1 | | Pass 2 | |
| --- | --- | --- | --- |
| Address | Count | Address | Count |
| 0 | 0 | 7 | 3 |
| 1 | 1 | 6 | 4 |
| 2 | 2 | 5 | 0 |
| 3 | 3 | 4 | 1 |
| 4 | 4 | 3 | 2 |
| 5 | 0 | 2 | 3 |
| 6 | 1 | 1 | 4 |
| 7 | 2 | 0 | 0 |

In such implementations, the error signature includes a prefix that indicates the direction, the address sequence, or both. For the above example shown in Table 2, the error signature can include a prefix that is set to "1" to indicate an ascending direction and set to "0" to indicate a descending direction, as shown in Table 3 below. By including a prefix in the error signature, each error signature generated during a test sequence that accesses memory locations in both ascending and descending directions is unique, and an error signature will repeat after 40 error signatures have been generated. For each repetition of the test sequence, the error signatures will repeat in the same order.

| Pass 1 | | | Pass 2 | | |
| --- | --- | --- | --- | --- | --- |
| Prefix | Address | Count | Prefix | Address | Count |
| 1 | 0 | 0 | 0 | 7 | 3 |
| 1 | 1 | 1 | 0 | 6 | 4 |
| 1 | 2 | 2 | 0 | 5 | 0 |
| 1 | 3 | 3 | 0 | 4 | 1 |
| 1 | 4 | 4 | 0 | 3 | 2 |
| 1 | 5 | 0 | 0 | 2 | 3 |
| 1 | 6 | 1 | 0 | 1 | 4 |
| 1 | 7 | 2 | 0 | 0 | 0 |

Table 3For a test command issued by the BIST sequencer 108, the BIST sequencer 108 may send the prefix, the address, the modulo counter value, and the expected data to a pipeline delay 118. The pipeline delay 118 delays the prefix, the address, the modulo counter value, and the expected data by the same number of cycles. The pipeline delay 118 runs synchronously with the BIST sequencer 108 and may enable the BIST circuitry 102 to operate at the rated functional speed or the intended operating speed of the memory 104. The number of cycles of the pipeline delay 118 may be programmed to correspond to the length of time for the test command issued by the BIST sequencer 108 to be received by the memory 104. For example, the number of clock cycles may be zero when a wire over which the test command is transmitted between the pipeline delay 118 and the memory 104 is very short. When the wire is very long, the pipeline delay 118 may delay the test command for multiple clock cycles to provide the test command to the memory 104 for multiple clock cycles so that the memory 104 has enough time to respond to the test command before transmitting another test command to the memory 104.

The BIST circuitry 102 may include a BIST collar 120 that applies the test sequence to the memory 104, and detects and stores errors during execution of the test sequence. The BIST collar 120 runs synchronously with the BIST sequencer 108 and the memory 104. The BIST collar 120 sends the address from the pipeline delay 118 to the memory 104 to access the memory location associated with the address. Because the memory 104 may have at least one cycle of latency between the time when the memory 104 receives the address and the time when the memory 104 provides the data stored at the memory location associated with the address, the BIST collar 120 may include a memory latency delay 122 that delays the prefix, the address, the modulo count value, and the expected data by the number of cycles for the data to be read from the memory 104.

The BIST collar 120 includes an error logging register 124 that stores error information, such as a prefix, an address, a modulo count value, and data associated with a detected error. The detected error may be an intermittent error, e.g., an error that occurs during one execution of multiple executions of the test sequence, or a consistently repeatable error, e.g., an error that occurs during all executions of the test sequence. The error logging register 124 may include a valid bit field that is reset to "0" and set to "1" when error information is stored in the error logging register 124. The error information stored in the error logging register 124 may be read by the external test controller 107 through the TAP 106.

The BIST collar 120 compares the error signature, e.g., the concatenated prefix, address, and modulo count value, from the memory latency delay 122 with an error signature stored in the error logging register 124 using a comparator 126. When the error signature from the memory latency delay 122 and the error signature stored in the error logging register 124 is the same, the comparator 126 asserts a signature match signal. The BIST collar 120 compares the data provided by the memory 104 with the expected data from the memory latency delay 122 using a comparator 128. When the data from the memory 104 and the expected data are different, the comparator 124 asserts an error detected signal.

Figure 2:
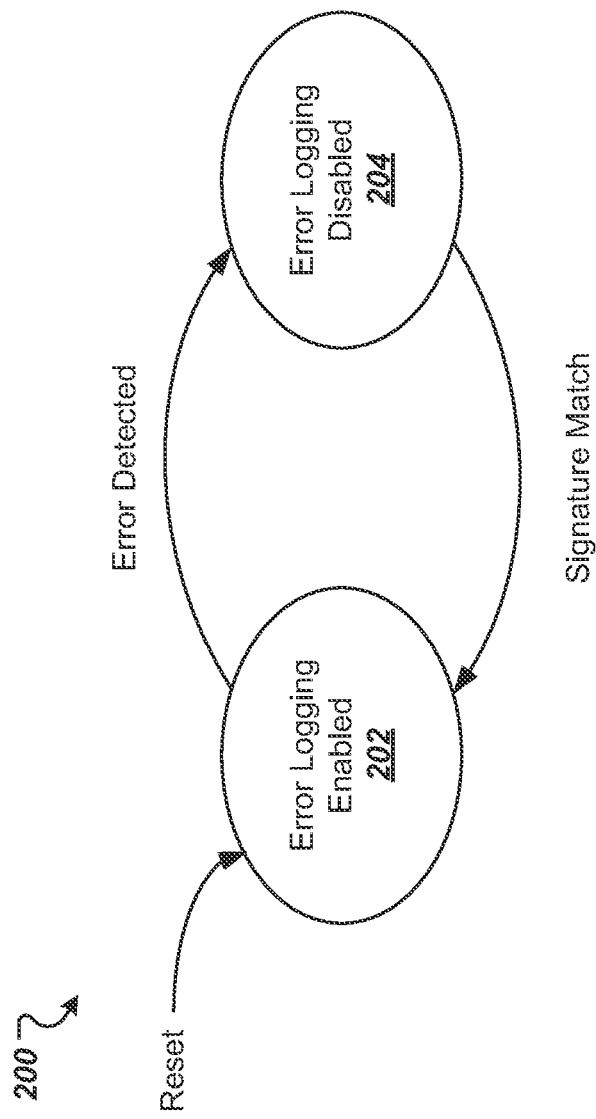
FIG. 2 is a state diagram showing examples of states of an error logging state machine of a BIST.

The BIST collar 120 includes an error logging state machine 130 that generates a logging control signal using the signature match signal and the error detected signal. FIG. 2 is a state diagram 200 showing examples of states of the error logging state machine 130. When the error logging state machine 130 receives an asserted reset signal, the error logging state machine 130 resets to an error logging enabled state 202 and asserts the logging enabled signal. When the error logging state machine 130 receives an asserted error detected signal, the error logging state machine 130 transitions to an error logging disabled state 204 and unasserts the logging enabled signal. When the error logging state machine 130 receives an asserted signature match signal, the error logging state machine 130 transitions to the error logging enabled state 202 and asserts the logging enabled signal.

Returning to FIG. 1, the BIST collar 120 stores error information in the error logging register 124 when the logging enabled signal is asserted, and the error detected signal is asserted. The error information includes the prefix, the address, and the modulo count value from the memory latency delay 122 and the data provided by the memory 104.

Figure 3:
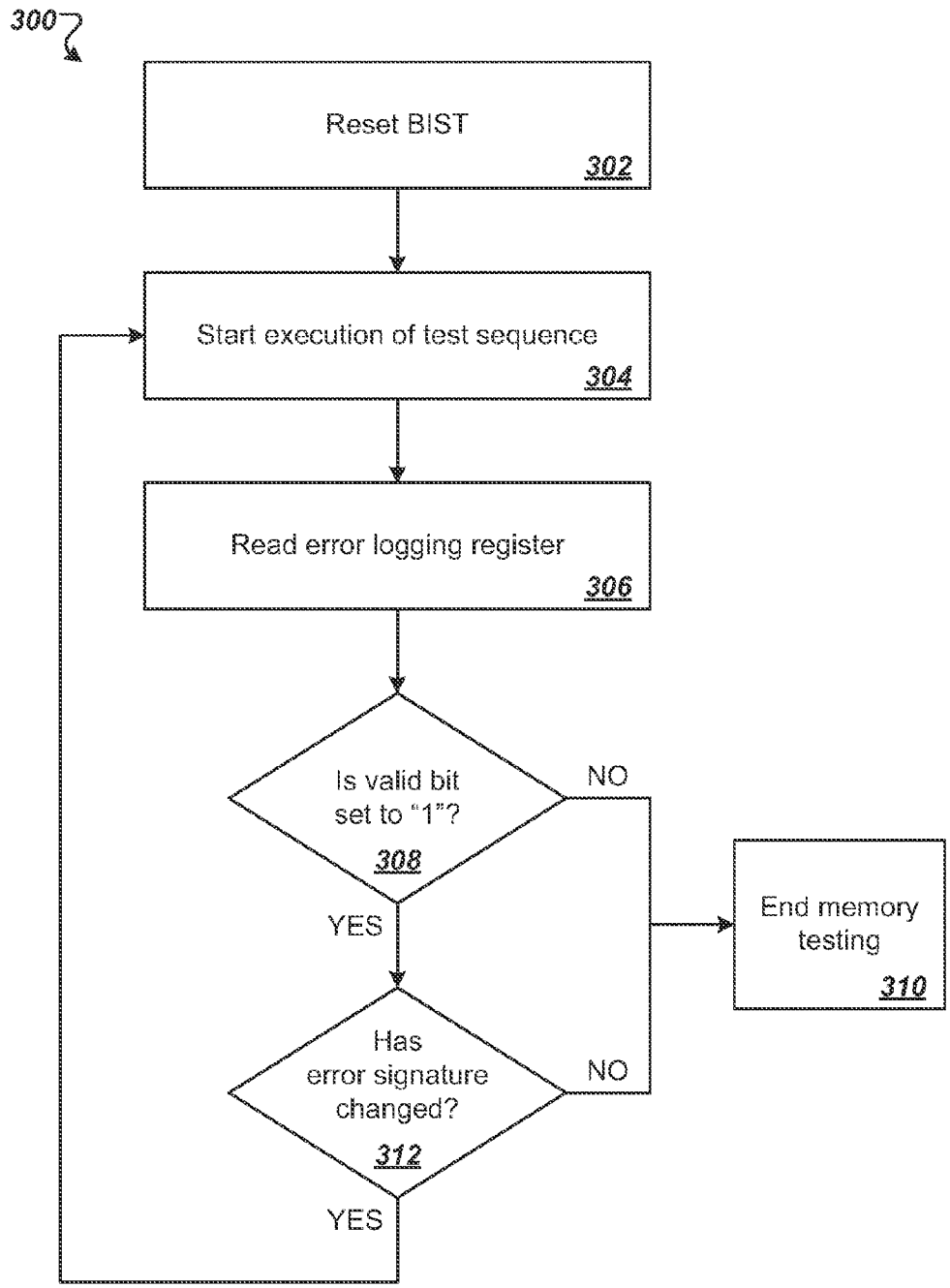
FIG. 3 is a flowchart showing examples of operations performed by an external test controller to test a memory using a BIST.
Figure 4:
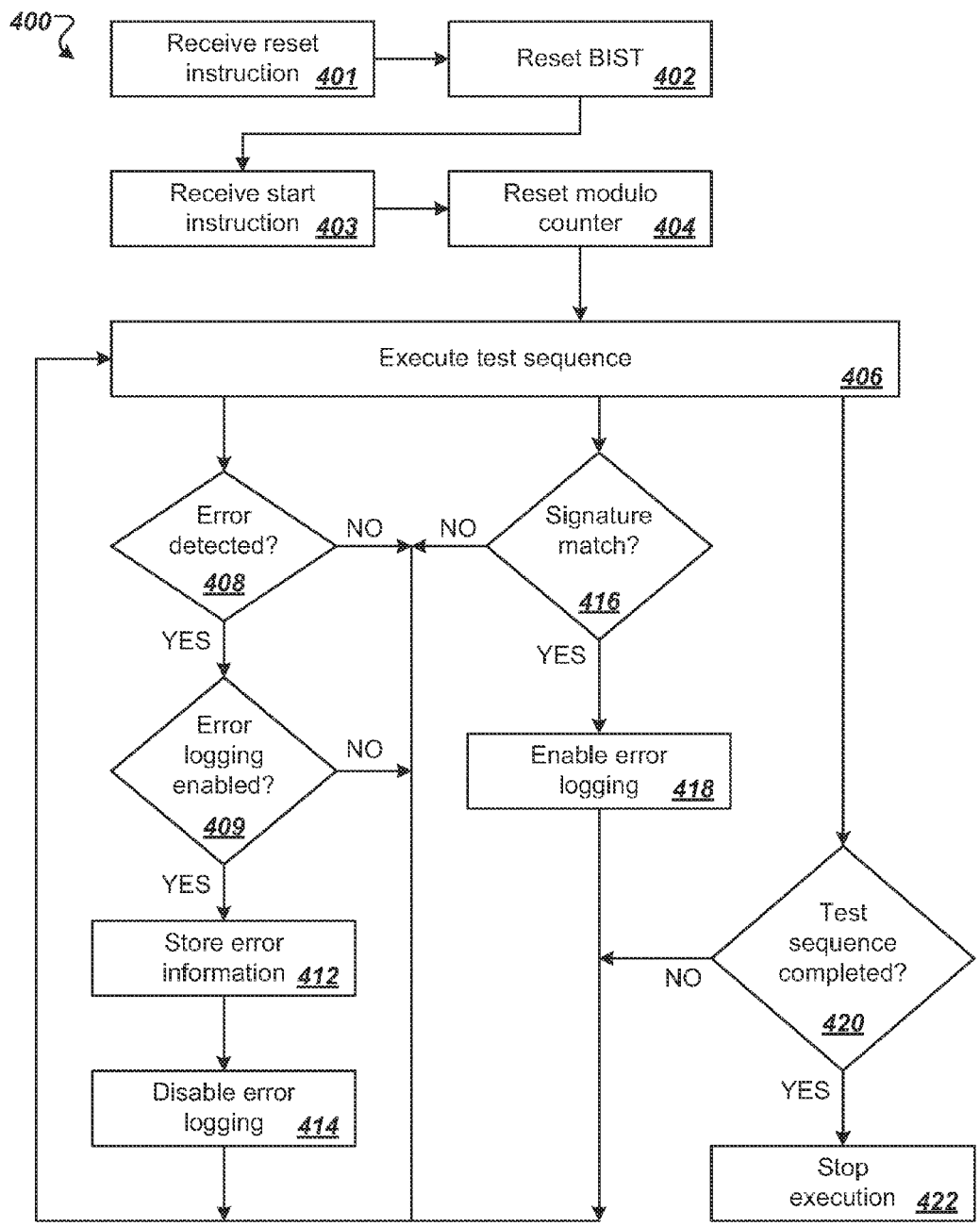
FIG. 4 is a flowchart showing examples of operations performed by a BIST to test a memory.

FIG. 3 is a flowchart showing examples of operations 300 performed by the external test controller 107 to test the memory 104 using the BIST circuitry 102. FIG. 3 is described in conjunction with FIG. 4, which is a flowchart showing examples of operations 400 performed by the BIST circuitry 102 to test the memory 104.

At the start of memory testing, the external test controller 107 sends an instruction to the BIST circuitry 102 to reset the BIST circuitry 102 at 302. When the BIST circuitry 102 receives the reset instruction from the external test controller 107 to reset at 401, the BIST circuitry 102 resets the state of the error logging state machine 130 to the error logging enabled state and the valid bit of the error logging register 124 to "0" at 402.

At 304, the external test controller 107 sends an instruction to the state machine 110 to start execution of the test sequence. When the state machine 110 receives the instruction to start execution of the test sequence at 403, the state machine 110 resets the modulo counter 114 to its initial state at 404. At 406, the state machine 110 executes the test sequence.

If the BIST circuitry 102 does not detect an error at 408, the BIST circuitry 102 continues execution of the test sequence at 406. If the BIST circuitry 102 detects an error at 408, the BIST circuitry 102 determines that error logging is enabled at 409. At 412, the BIST circuitry 102 stores information associated with the error in the error logging register 124. At 414, the BIST circuitry 102 disables error logging. The error logging state machine 130 transitions to the error logging disabled state and unasserts the logging enabled signal. At 406, the BIST circuitry 102 continues execution of the test sequence. For the remainder of the first execution of the test sequence, the BIST circuitry 102 disregards any errors detected after detecting the first error. When the BIST circuitry 102 determines that execution of the test sequence has completed at 420, the BIST circuitry 102 stops execution of the test sequence at 422.

After the BIST circuitry 102 executes the test sequence to completion, the external test controller 107 reads the error information from the error logging register 124 at 306. At 308, the external test controller 107 checks the valid bit read from the error logging register 124. If the valid bit is "0" after the first execution of the test sequence, the external test controller 107 determines that the memory 104 is error free and ends testing of the memory 104 at 310. If the valid bit is "1" after the first execution of the test sequence, the error information will include information associated with the first error detected by the BIST circuitry 102.

If the valid bit is "1" after the first execution of the test sequence, the external test controller 107 determines that the error signature has changed at 312 and sends an instruction to the state machine 110 to start execution of the test sequence at 304. When the state machine 110 receives the instruction to start execution of the test sequence at 403, the state machine 110 resets the modulo counter 114 to its initial state at 404. At 406, the state machine 110 executes the test sequence.

If the BIST circuitry 102 detects the first error during the second execution of the test sequence at 408, the BIST circuitry 102 will disregard the first error because the error logging state machine 130 is in the error logging disabled state at 409. Because an error signature associated with the first error was stored in the error logging register 124 during the first execution and error signatures repeat in the same order for each repetition of the test sequence, the error signature stored in the error logging register 124 will match an error signature generated during the second execution of the test sequence. When the BIST circuitry 102 detects the matching error signatures at 416, the BIST circuitry 102 enables error logging at 418. The error logging state machine 130 transitions to the error logging enabled state and asserts the logging enabled signal in the next clock cycle to enable storing of information associated with a second error that occurs after the first error in the test sequence. The BIST circuitry 102 continues execution of the test sequence at 406.

If the BIST circuitry 102 detects a second error at 408, the BIST circuitry 102 determines that error logging is enabled at 409. The BIST circuitry 102 stores information associated with the second error at 412 and disables error logging at 414. The error logging state machine 130 transitions to the error logging disabled state and unasserts the logging enabled signal. At 406, the BIST circuitry 102 continues the second execution of the test sequence. For the remainder of the second execution of the test sequence, the BIST circuitry 102 disregards any errors detected after detecting the second error. When the BIST circuitry 102 determines that second execution of the test sequence has completed at 420, the BIST circuitry 102 stops the second execution of the test sequence at 422.

After the second execution of the test sequence has completed, the external test controller 107 reads the error information from the error logging register 124 at 308. For each execution after the first execution, the external test controller 107 determines that the valid bit is "1". If the BIST circuitry 102 did not detect a second error during the second execution, the external test controller 107 determines that the error signature has not changed at 312 between the first execution and the second execution and ends memory testing at 310. If the BIST circuitry 102 detected a second error during the second execution, the external test controller 107 determines that the error signature has changed between the first execution and the second execution at 312 and starts another execution of the test sequence at 304.

In general, for each subsequent execution of the test sequence after the first execution, the BIST circuitry 102 detects a match between the error signature stored in the error logging register 124 and an error signature generated during the subsequent execution of the test sequence at 416. When the match is detected, the BIST circuitry 102 enables error logging at 418. The error logging state machine 130 transitions to the error logging enabled state and asserts the error logging enabled signal.

The next error that the BIST circuitry 102 detects at 408 will have an error signature that occurs after the matching error signature in the test sequence. Because error logging is enabled at 409, the BIST circuitry 102 stores information associated with the error at 412. At 414, the BIST circuitry 102 disables error logging. The error logging state machine 130 transitions to the error logging disabled state and unasserts the error logging enabled signal. At 406, the BIST circuitry 102 continues execution of the test sequence. For the remainder of the subsequent execution, the BIST circuitry 102 disregards any errors detected after the error logging is disabled. When the BIST circuitry 102 determines that the subsequent execution of the test sequence has completed at 420, the BIST circuitry 102 stops the execution of the test sequence at 422.

After each subsequent execution of the test sequence has completed, the external test controller 107 reads the error information from the error logging register 124 at 308. For each execution after the first execution, the external test controller 107 determines that the valid bit is "1". If the BIST circuitry 102 did not detect any other error during the subsequent execution, the external test controller 107 determines that the error signature has not changed at 312 between the first execution and the second execution and ends memory testing at 310. If the BIST circuitry 102 detected another error during the subsequent execution, the external test controller 107 determines that the error signature is different from the error signature stored during the previous execution at 312 and starts another execution of the test sequence at 304.

Execution of the test sequence is repeated until the external test controller determines that the error signature has not changed between successive executions at 312 and ends memory testing at 310. Through repeated executions of the test sequence, all errors detected during the testing of the memory 104 can be reported to the external test controller 107. The BIST circuitry 102 can detect and report consistently repeatable errors and intermittent errors by matching error signatures generated during multiple executions of the test sequence.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations. Other implementations fall within the scope of the following claims.

What is claimed is:

1. A method comprising:
    performing, by memory testing circuitry, an execution of a test sequence to test a memory device, wherein performing the execution comprises generating addresses of the memory device in accordance with the test sequence and advancing a value of a modulo counter as each of the addresses is generated;
    enabling error logging when a generated address and a value of the modulo counter corresponding to the generated address match an address and a value of the modulo counter stored for a previously detected error;
    detecting an error in data read from the memory device after enabling error logging; and
    storing information associated with the detected error, wherein storing the information comprises storing an address generated for reading the data associated with the detected error from a location of the memory device and storing a value of the modulo counter corresponding to the address generated for reading the data.

2. The method of claim 1, wherein performing the execution of the test sequence to test the memory device comprises:
    performing execution of the test sequence from a first address of the test sequence to a last address of the test sequence, uninterrupted, at an intended operating speed of the memory device.

3. The method of claim 2, wherein performing the execution of the test sequence at the intended operating speed of the memory device comprises:
    providing each address of the generated addresses to the memory device for a plurality of clock cycles.

4. The method of claim 1, further comprising:
    performing one or more other executions of the test sequence to test the memory device, wherein the previously detected error is associated with an execution of the one or more other executions, and the previously detected error is an intermittent error.

5. The method of claim 1, further comprising:
    for each of the addresses generated in accordance with the test sequence, combining the generated address and a corresponding value of the modulo counter to generate an error signature, wherein each error signature is different from other error signatures generated during the execution of the test sequence, and a maximum number of count values generated by the modulo counter is a relative prime of a number of memory locations accessed during the execution of the test sequence.

6. The method of claim 1, further comprising:
    unasserting an error logging enable signal during a previous execution to disable error logging when performing of the execution of the test sequence begins;
    asserting the unasserted error logging enable signal when error logging is enabled; and
    unasserting the asserted error logging enable signal to disable error logging in response to detecting the error.

7. The method of claim 1, wherein the memory testing circuitry is built-in self-test (BIST) circuitry of the memory device, and the memory testing circuitry runs synchronously with the memory device.

8. An apparatus comprising:
    a memory device; and
    built-in self-test (BIST) circuitry of the memory device, the BIST circuitry configured to:
        perform an execution of a test sequence to test the memory device, wherein performing the execution comprises generating addresses of the memory device in accordance with the test sequence and advancing a value of a modulo counter as each of the addresses is generated,
        enable error logging when a generated address and a value of the modulo counter corresponding to the generated address match an address and a value of the modulo counter stored for a previously detected error,
        detect an error in data read from the memory device after enabling error logging, and
        store information associated with the detected error, wherein storing the information comprises storing an address generated for reading the data associated with the detected error from a location of the memory device and storing a value of the modulo counter corresponding to the address generated for reading the data.

9. The apparatus of claim 8, wherein the BIST circuitry is configured to perform the execution of the test sequence from a first address of the test sequence to a last address of the test sequence, uninterrupted, at an intended operating speed of the memory device.

10. The apparatus of claim 9, wherein the BIST circuitry is configured to provide each address of the generated addresses to the memory device for a plurality of clock cycles.

11. The apparatus of claim 8, wherein the BIST circuitry is configured to perform one or more other executions of the test sequence to test the memory device, wherein the previously detected error is associated with an execution of the one or more other executions, and the previously detected error is an intermittent error.

12. The apparatus of claim 8, wherein the BIST circuitry is configured to combine, for each of the addresses generated in accordance with the test sequence, the generated address and a corresponding value of the modulo counter to generate an error signature, wherein each error signature is different from other error signatures generated during the execution of the test sequence, and a maximum number of count values generated by the modulo counter is a relative prime of a number of memory locations accessed by the BIST circuitry during the execution of the test sequence.

13. The apparatus of claim 8, wherein the BIST circuitry is configured to:
 unassert an error logging enable signal during a previous execution to disable error logging when performing of the execution of the test sequence begins;
 assert the unasserted error logging enable signal when error logging is enabled; and
 unassert the asserted error logging enable signal to disable error logging in response to detecting the error.

14. The apparatus of claim 8, wherein the BIST circuitry runs synchronously with the memory device.

15. A system comprising:
 an external test controller; and
 a memory device that includes built-in self-test (BIST) circuitry, the BIST circuitry coupled to the external test controller, the BIST circuitry configured to:
  receive an instruction from the external test controller to perform an execution of a test sequence to test the memory device,
  perform the execution of the test sequence, wherein performing the execution comprises generating addresses of the memory device in accordance with the test sequence and advancing a value of a modulo counter as each of the addresses is generated,
  enable error logging when a generated address and value of the modulo counter corresponding to the generated address match an address and a value of the modulo counter stored for a previously detected error,
  detect an error in data read from the memory device after enabling error logging, and
  store information associated with the detected error, wherein storing the information comprises storing an address generated for reading the data associated with the detected error from a location of the memory device and storing a value of the modulo counter corresponding to the address generated for reading the data,
 wherein the external test controller is configured to:
  read the stored information associated with the detected error from the BIST circuitry.

16. The system of claim 15, wherein the BIST circuitry is configured to perform the execution of the test sequence from a first address of the test sequence to a last address of the test sequence, uninterrupted, at an intended operating speed of the memory device.

17. The system of claim 16, wherein the BIST circuitry is configured to provide each address of the generated addresses to the memory device for a plurality of clock cycles.

18. The system of claim 15, wherein the BIST circuitry is configured to perform one or more other executions of the test sequence to test the memory device, wherein the previously detected error is associated with an execution of the one or more other executions, and the previously detected error is an intermittent error.

19. The system of claim 15, wherein the BIST circuitry is configured to combine, for each of the addresses generated in accordance with the test sequence, the generated address and a corresponding value of the modulo counter to generate an error signature, wherein each error signature is different from other error signatures generated during the execution of the test sequence, and a maximum number of count values generated by the modulo counter is a relative prime of a number of memory locations accessed by the BIST circuitry during the execution of the test sequence.

20. The system of claim 15, wherein the BIST circuitry is configured to:
 unassert an error logging enable signal during a previous execution to disable error logging when performing of the execution of the test sequence begins;
 assert the unasserted error logging enable signal when error logging is enabled; and
 unassert the asserted error logging enable signal in response to detecting the error.

21. The system of claim 15, wherein the BIST circuitry runs synchronously with the memory device.

22. The system of claim 15, wherein the external test controller is configured to:
 determine that the address and the value of the modulo counter included in the stored information is different from an address and a value of the modulo counter included in information read from a previous execution of the test sequence; and
 send another instruction to the BIST circuitry to perform another execution of the test sequence to test the memory device.

* * * * *